(12) United States Patent
Ao

(10) Patent No.: US 8,918,991 B2
(45) Date of Patent: Dec. 30, 2014

(54) PROCESS FOR PROVIDING ELECTRICAL CONNECTIONS WITH REDUCED VIA CAPACITANCE ON CIRCUIT BOARDS

(75) Inventor: Eric R. Ao, Nepean (CA)

(73) Assignee: Lenovo Enterprise Solutions (Singapore) Pte. Ltd., New Tech Park (SG)

( * ) Notice: Subject to any disclaimer, the term of this patent is extended or adjusted under 35 U.S.C. 154(b) by 228 days.

(21) Appl. No.: 13/289,995

(22) Filed: Nov. 4, 2011

(65) Prior Publication Data

US 2013/0111745 A1    May 9, 2013

(51) Int. Cl.
   *H01K 3/10*   (2006.01)
   *H05K 3/30*   (2006.01)
   *H05K 1/11*   (2006.01)
   *H05K 1/02*   (2006.01)

(52) U.S. Cl.
   CPC ............ *H05K 1/0251* (2013.01); *H05K 1/0245* (2013.01); *H05K 2201/09645* (2014.01)
   USPC ............... 29/852; 29/837; 174/261; 174/262; 174/263

(58) Field of Classification Search
   CPC .. H05K 1/0251; H05K 3/3447; H05K 3/4069
   USPC ............ 29/852, 837; 174/261, 262, 263
   See application file for complete search history.

(56) References Cited

U.S. PATENT DOCUMENTS

| | | | | |
|---|---|---|---|---|
| 4,543,715 A * | 10/1985 | Iadarola et al. | ............ | 29/852 |
| 5,021,866 A * | 6/1991 | Sudo et al. | ............ | 257/736 |
| 6,040,524 A * | 3/2000 | Kobayashi et al. | ............ | 174/36 |
| 6,137,064 A * | 10/2000 | Kiani et al. | ............ | 174/266 |
| 6,891,272 B1 * | 5/2005 | Fjelstad et al. | ............ | 257/774 |
| 6,992,255 B2 * | 1/2006 | Oprysko et al. | ............ | 174/262 |
| 7,204,018 B2 * | 4/2007 | Kwong et al. | ............ | 29/837 |
| 7,385,470 B2 * | 6/2008 | Kwong et al. | ............ | 333/260 |
| 7,470,864 B2 * | 12/2008 | Ho et al. | ............ | 174/262 |
| 8,604,357 B2 | 12/2013 | Takeda | | |
| 2002/0074162 A1 * | 6/2002 | Su et al. | ............ | 174/262 |
| 2002/0179332 A1 * | 12/2002 | Uematsu et al. | ............ | 174/262 |
| 2005/0133251 A1 * | 6/2005 | Chiu | ............ | 174/259 |
| 2006/0125573 A1 * | 6/2006 | Brunette et al. | ............ | 333/33 |
| 2006/0247482 A1 * | 11/2006 | Hope et al. | ............ | 585/521 |
| 2007/0089902 A1 | 4/2007 | Tourne et al. | | |
| 2013/0111745 A1 * | 5/2013 | Ao | ............ | 29/837 |
| 2013/0112470 A1 | 5/2013 | Ao | | |

OTHER PUBLICATIONS

U.S. Restriction Requirement for U.S. Appl. No. 13/289,987 mailed Nov. 21, 2013.

(Continued)

*Primary Examiner* — David Angwin

(57) ABSTRACT

The present invention relates to circuit boards and, more specifically, a process for providing electrical connections with reduced via capacitance on circuit boards. In one embodiment, the present invention provides a method for providing an electrical connection between traces disposed on different layers of a circuit board, the method comprising forming in the board a via hole that extends between the different layers and interconnects a pair of electrically conductive traces disposed on the different layers. An inner sidewall of the via hole includes electrically conductive material thereon. The method further comprises removing a first portion of the conductive material from the inner sidewall by removing a first portion of the inner sidewall. A remaining portion of the conductive material on a remaining portion of the inner sidewall interconnects the pair of traces and has a corresponding width that is substantially similar to a width of each trace.

22 Claims, 12 Drawing Sheets

(56) References Cited

OTHER PUBLICATIONS

U.S. Final Office Action for U.S. Appl. No. 13/289,987 mailed Jun. 18, 2014.

U.S. non-Final Office Action for U.S. Appl. No. 13/289,987 mailed Feb. 6, 2014.

* cited by examiner

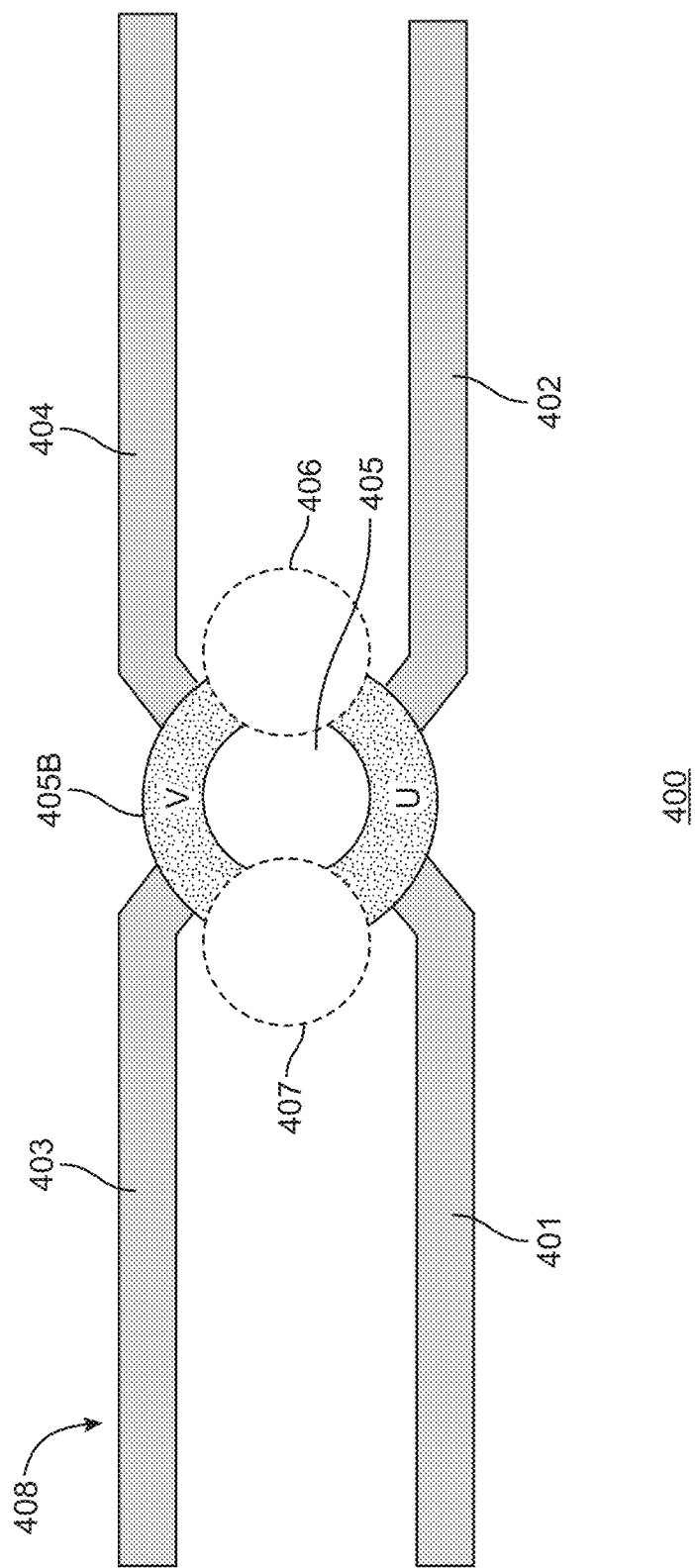

PROCESS FOR PROVIDING ELECTRICAL CONNECTIONS WITH REDUCED VIA CAPACITANCE ON CIRCUIT BOARDS

BACKGROUND

The present invention relates to circuit boards and, more specifically, a process for providing electrical connections with reduced via capacitance on circuit boards.

A via is a common structure in a circuit board used to connect transmission traces, such as strip-line or micro-strip traces, formed on different layers of the circuit board. A via is typically realized by drilling a hole through the traces to be connected, and plating the via with electrically conductive material such as copper. The width of the traces, for example between 4 micro inches (MIL) and 7 MIL, is smaller than the width of the electrically conductive material on the via. The example numerical range provided for the width of the traces is an approximate numerical range only, and the present invention is not limited to traces with a width within this numerical range. Because of this difference in physical measurement, the via is plated with more electrically conductive material than the traces it interconnects. The excess electrically conductive material on the via tends to create excessive capacitance, resulting in impedance discontinuity in signal transmissions between traces interconnected using the via.

BRIEF SUMMARY

The present invention relates to circuit boards and, more specifically, a process for providing electrical connections with reduced via (i.e. via hole) capacitance on circuit boards.

In one embodiment, the present invention provides a method for providing an electrical connection between traces disposed on different layers of a circuit board, the method comprising forming in the circuit board a via hole that interconnects a first electrically conductive trace and a second electrically conductive trace. The via hole includes electrically conductive material thereon. The method further comprises removing a portion of the electrically conductive material from the via hole.

In another embodiment, the present invention provides a method for providing an electrical connection between traces disposed on different layers of a circuit board, the method comprising forming in the circuit board a first via hole and a second via hole. The first via hole interconnects a first electrically conductive trace and a second electrically conductive trace, and the second via hole interconnects a third electrically conductive trace and a fourth electrically conductive trace. Each via hole includes electrically conductive material thereon. The method further comprises removing a portion of the electrically conductive material from each via hole.

In another embodiment, the present invention provides a method for providing an electrical connection between traces disposed on different layers of a circuit board, the method comprising forming in the circuit board a via hole. The via hole bridges a first electrically conductive trace and a second electrically conductive trace. The via hole also bridges a third electrically conductive trace and a fourth electrically conductive trace. The via hole includes electrically conductive material thereon. The method further comprises removing a first and a second portion of the electrically conductive material from the via hole.

These and other features, aspects and advantages of the present invention will become understood with reference to the following description, appended claims and accompanying figures.

BRIEF DESCRIPTION OF THE SEVERAL VIEWS OF THE DRAWINGS

FIG. 5B illustrates another top view of the circuit board in FIG. 5A, in accordance with an embodiment of the invention;

DETAILED DESCRIPTION

The present invention relates to circuit boards and, more specifically, a process for providing electrical connections with reduced via (i.e. via hole) capacitance on circuit boards.

In one embodiment, the present invention provides a method for providing an electrical connection between traces disposed on different layers of a circuit board, the method comprising forming in the circuit board a via hole that interconnects a first electrically conductive trace and a second electrically conductive trace. The via hole includes electrically conductive material thereon. The method further comprises removing a portion of the electrically conductive material from the via hole.

In another embodiment, the present invention provides a method for providing an electrical connection between traces disposed on different layers of a circuit board, the method comprising forming in the circuit board a first via hole and a second via hole. The first via hole interconnects a first electrically conductive trace and a second electrically conductive trace, and the second via hole interconnects a third electrically conductive trace and a fourth electrically conductive trace. Each via hole includes electrically conductive material thereon. The method further comprises removing a portion of the electrically conductive material from each via hole.

In another embodiment, the present invention provides a method for providing an electrical connection between traces disposed on different layers of a circuit board, the method comprising forming in the circuit board a via hole. The via hole bridges a first electrically conductive trace and a second electrically conductive trace. The via hole also bridges a third electrically conductive trace and a fourth electrically conductive trace. The via hole includes electrically conductive material thereon. The method further comprises removing a first and a second portion of the electrically conductive material from the via hole.

Figure 1A:
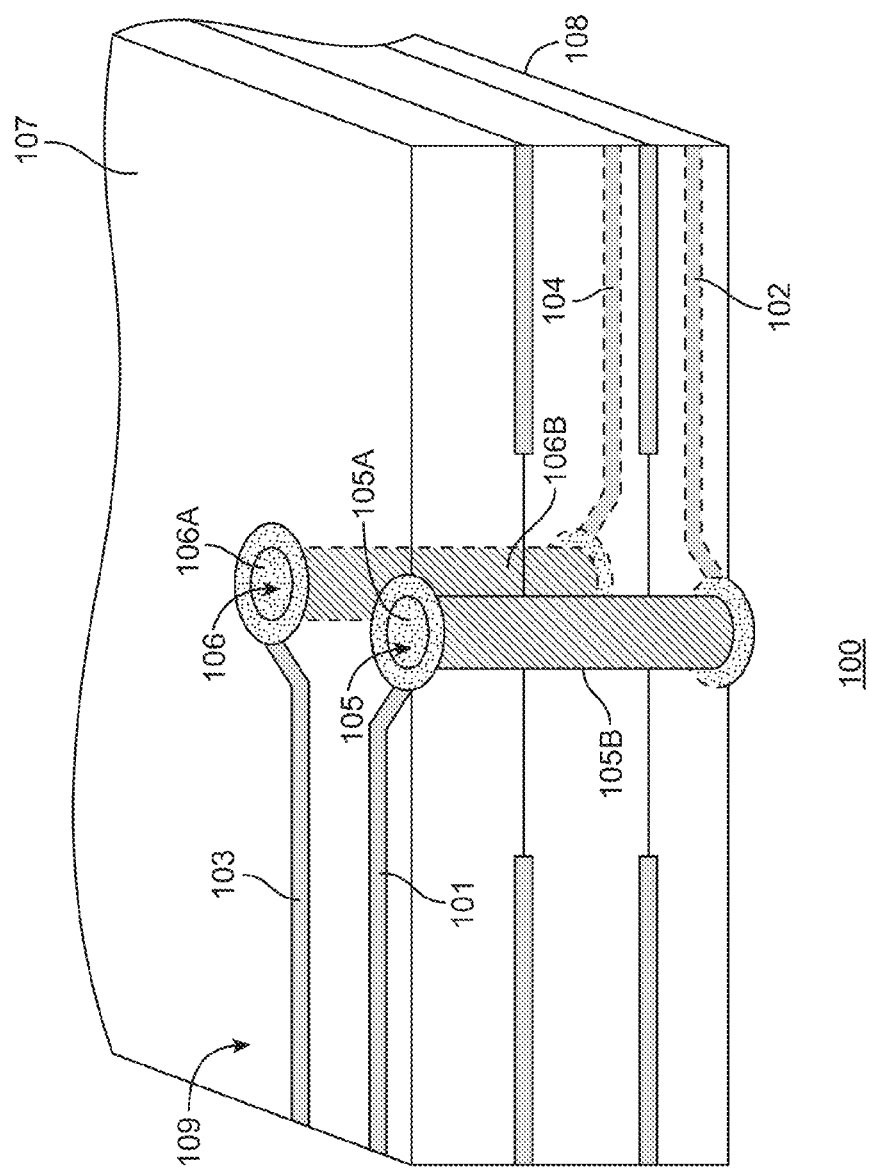
FIG. 1A illustrates a side perspective view of a circuit board including an edge-coupled differential pair with traces and via holes.

FIG. 1A illustrates a side perspective view of a circuit board 100 including an edge-coupled differential pair 109 with traces and vias. The circuit board 100 comprises multiple layers, such as layers 107 and 108. The circuit board 100 further comprises the differential pair 109 comprising traces 101, 102, 103, and 104. The traces 101 and 103 are formed on the layer 107 of the circuit board 100. The traces 102 and 104 are formed on the layer 108 of the circuit board 100.

The differential pair 109 further comprises via holes (i.e. vias) 105 and 106. The via hole 105 may be formed by drilling a hole through the traces 101 and 102. A sidewall 105B of the via hole 105 is plated with an electrically conductive material 105A, for example copper. The electrically conductive material 105A of the sidewall 105B forms an interconnect that electrically couples the trace 101 to the trace 102.

Similarly, the via hole 106 may be formed by drilling a hole through the traces 103 and 104. A sidewall 106B of the via hole 106 is plated with an electrically conductive material 106A, for example copper. The electrically conductive material 106A of the sidewall 106B forms an interconnect that electrically couples the trace 103 to the trace 104.

Figure 1B:
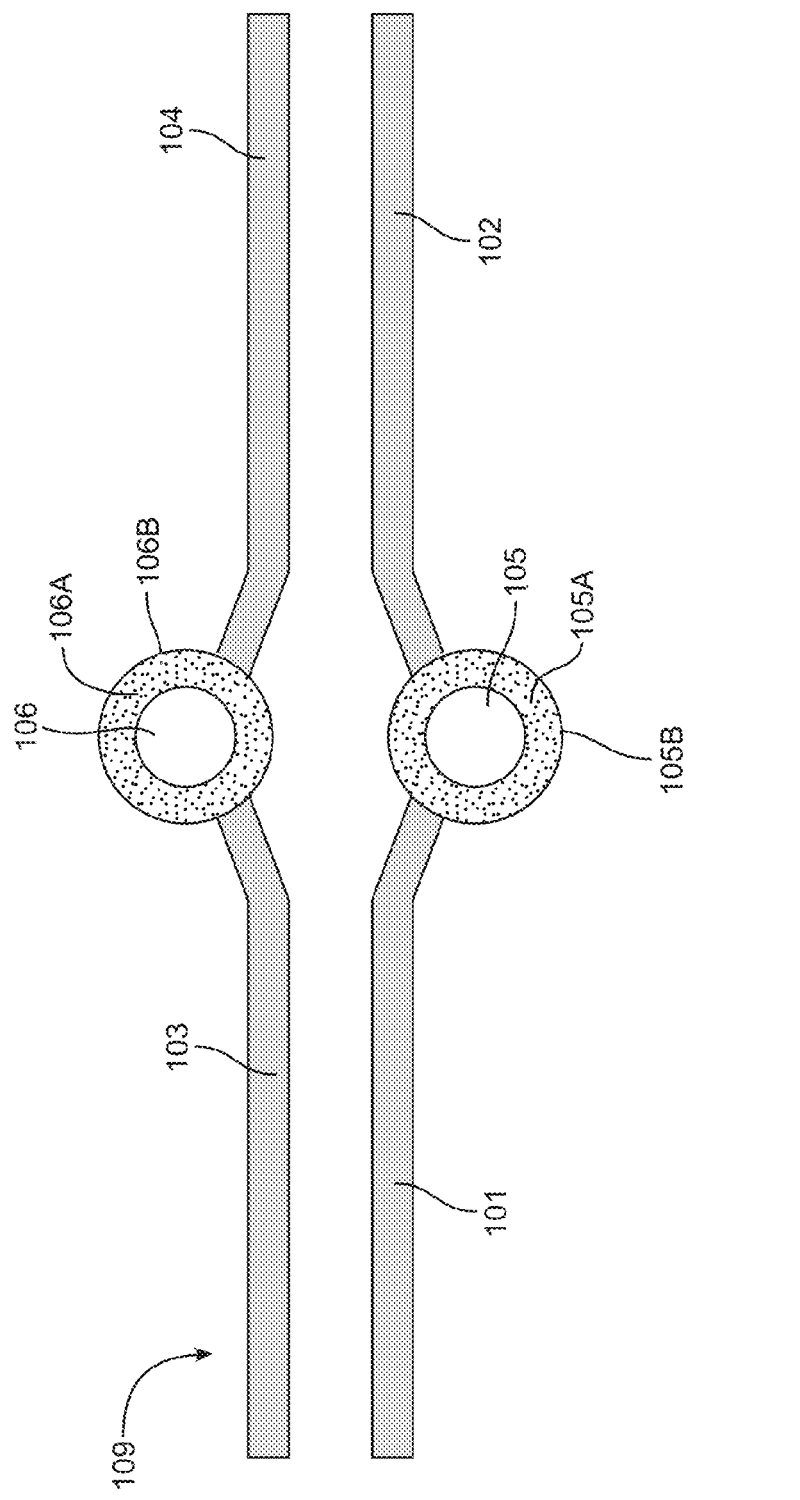
FIG. 1B illustrates a top view of the circuit board in FIG. 1A.

FIG. 1B illustrates a top view of the circuit board 100 in FIG. 1A. As shown in this figure, the electrically conductive material 105A of the sidewall 105B electrically couples the trace 101 to the trace 102, and the electrically conductive material 106A of the sidewall 106B electrically couples the trace 103 to the trace 104.

The electrically conductive material of each sidewall has a length and a width. In this specification, let x denote the length of the electrically conductive material, and let w denote the width of the electrically conductive material (FIG. 2C). The width of the traces 101, 102, 103, and 104, for example between 4 MIL and 7 MIL, is smaller than the width of the electrically conductive material 105A, 106A. The example numerical range provided for the width of the traces 101, 102, 103, and 104 is an approximate numerical range only, and the present invention is not limited to traces with a width within this numerical range. As a result of this difference in physical measurement (i.e. width), the electrically conductive material 105A, 106A tend to create excessive capacitance, resulting in impedance discontinuity in signal transmissions between interconnected traces.

Figure 2A:
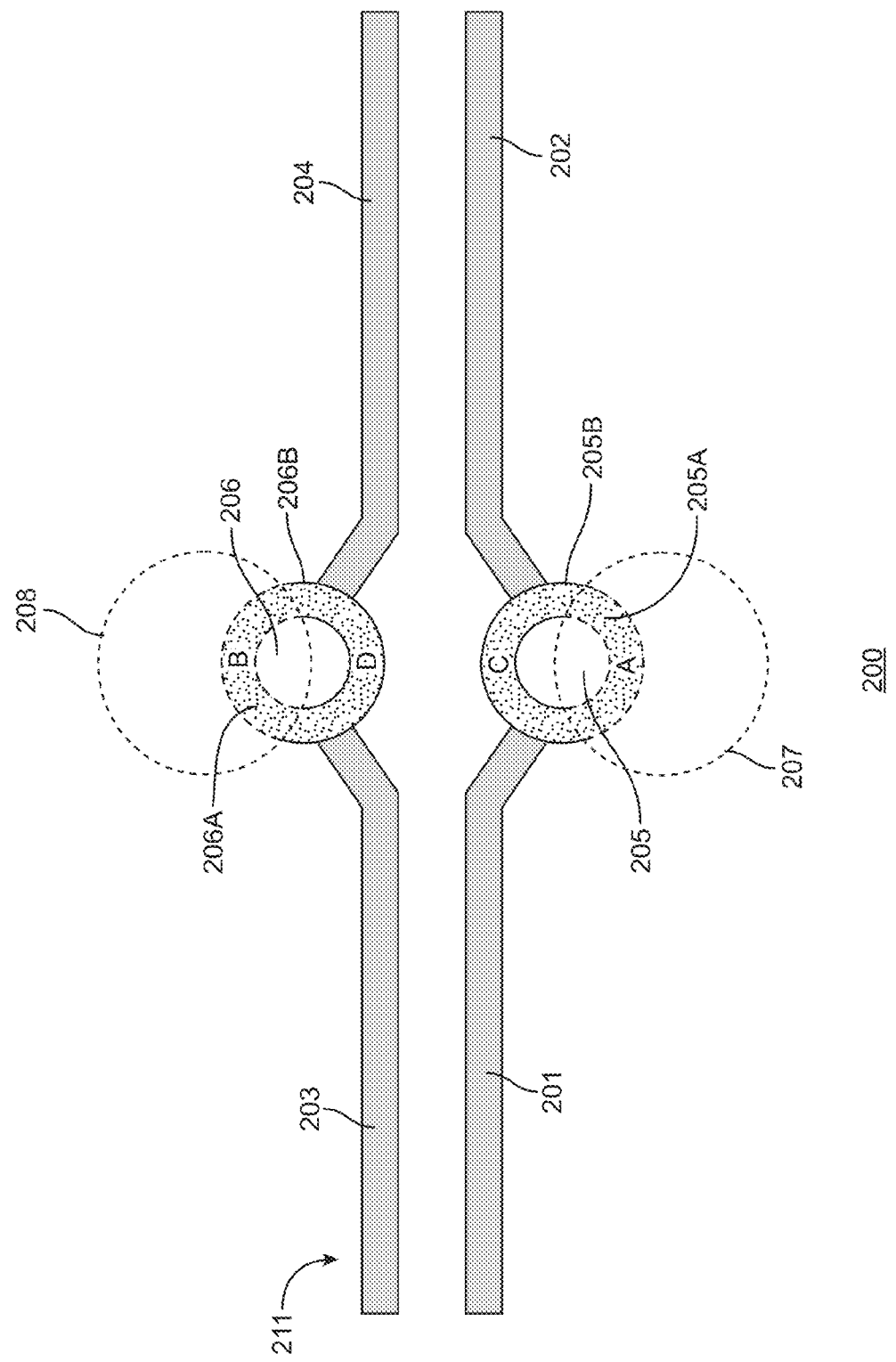
FIG. 2A illustrates a top view of a circuit board including an edge-coupled differential pair with traces and via holes with reduced via capacitance, in accordance with an embodiment of the invention.

FIG. 2A illustrates a top view of a circuit board 200 including an edge-coupled differential pair 211 with traces and via holes with reduced via capacitance, in accordance with an embodiment of the invention. In one example implementation, the circuit board 200 comprises multiple layers, such as layers 209 (FIG. 2C) and 210 (FIG. 2C). The circuit board 200 further comprises the differential pair 211 comprising traces 201, 202, 203, and 204. The traces 201 and 203 are formed on the layer 209 of the circuit board 200. The traces 202 and 204 are formed on the layer 210 of the circuit board 200.

In another example implementation, the traces 201 and 202 are located on a same layer of the circuit board 200. The traces 203 and 204 may also be located on a same layer the circuit board 200. In yet another example implementation, the circuit board 200 is double-sided, wherein the traces 201 and 203 are located on a first side of the circuit board 200, and the traces 202 and 204 are located on a second side of the circuit board 200.

The differential pair 211 further comprises via holes 205 and 206. The via hole 205 may be formed by drilling a hole through the traces 201 and 202. A sidewall 205B of the via hole 205 is plated with an electrically conductive material 205A, for example copper. The electrically conductive material 205A of the sidewall 205B forms an interconnect that electrically couples the trace 201 to the trace 202.

Similarly, the via hole 206 may be formed by drilling a hole through the traces 203 and 204. A sidewall 206B of the via hole 206 is plated with an electrically conductive material 206A, for example copper. The electrically conductive material 206A of the sidewall 206B forms an interconnect that electrically couples the trace 203 to the trace 204.

In one example implementation, the traces 201 and 202 are disposed on different sides of the via hole 205, and the traces 203 and 204 are disposed on different sides of the via hole 206. In another example implementation, the traces 201 and 202 are disposed on the same side of the via hole 205, and the traces 203 and 204 are disposed on the same side of the via hole 206.

The traces 201 and 202 may be made of a material that is similar to the electrically conductive material of the sidewall 205B of the via hole 205. Similarly, the traces 203 and 204 may be made of a material that is similar to the electrically conductive material of the sidewall 206B of the via hole 206. Further, the traces 201, 202, 203, 204, and the electrically conductive material of the sidewalls 205B and 206B of the via holes 205 and 206, respectively, may be made of similar materials such that the impedance between the traces 201 and 202 matches the impedance between the traces 203 and 204.

In accordance with an embodiment of the invention, excess conductive material is removed from the sidewalls 205B and 206B to reduce capacitance of the via holes 205 and 206, respectively. In one example implementation, holes (i.e. side-drill-holes) 207 and 208 are formed along the sidewalls 205B and 206B, respectively. The side-drill holes 207, 208 may be formed using drilling, milling, etching or other methods. The side-drill-hole 207 overlaps the via hole 205 and removes a section A of the sidewall 205B along with the electrically conductive material thereon. The side-drill-hole 207 removes excess conductive material from the sidewall 205B without depleting the sidewall 205B. Similarly, the side-drill-hole 208 overlaps the via hole 206 and removes a section B of the sidewall 206B along with the electrically conductive material thereon. The side-drill-hole 208 removes excess conductive material from the sidewall 206B without depleting the sidewall 206B.

The remaining sidewall (i.e. via hole segment) 205B after the excess conductive material is removed is illustrated in FIG. 2A as a section C of the sidewall 205B. Similarly, the remaining sidewall 206B after the excess conductive material is removed is illustrated in FIG. 2A as a section D of the sidewall 206B.

Figure 2B:
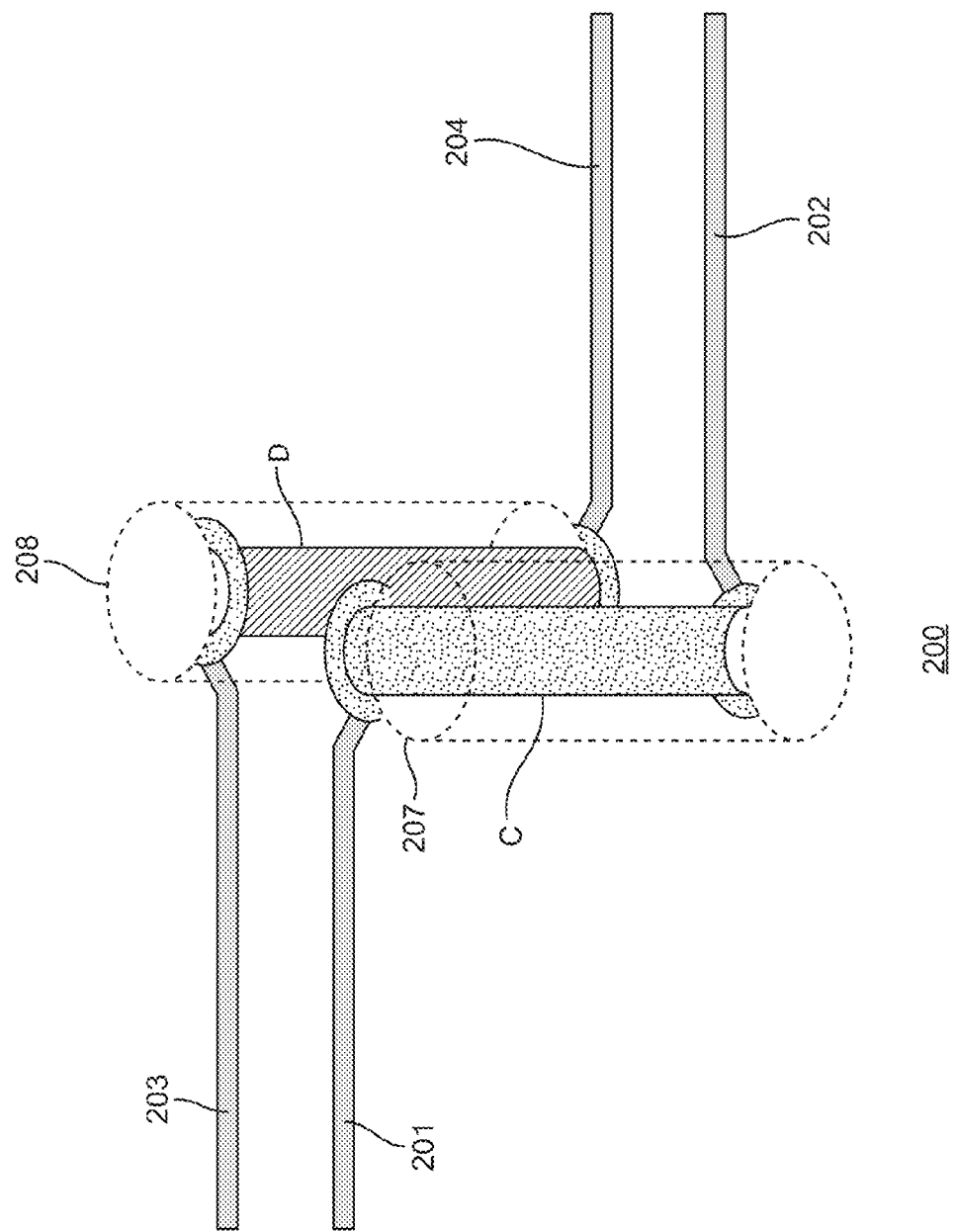
FIG. 2B illustrates a side perspective view of the circuit board in FIG. 2A, in accordance with an embodiment of the invention.
Figure 2C:
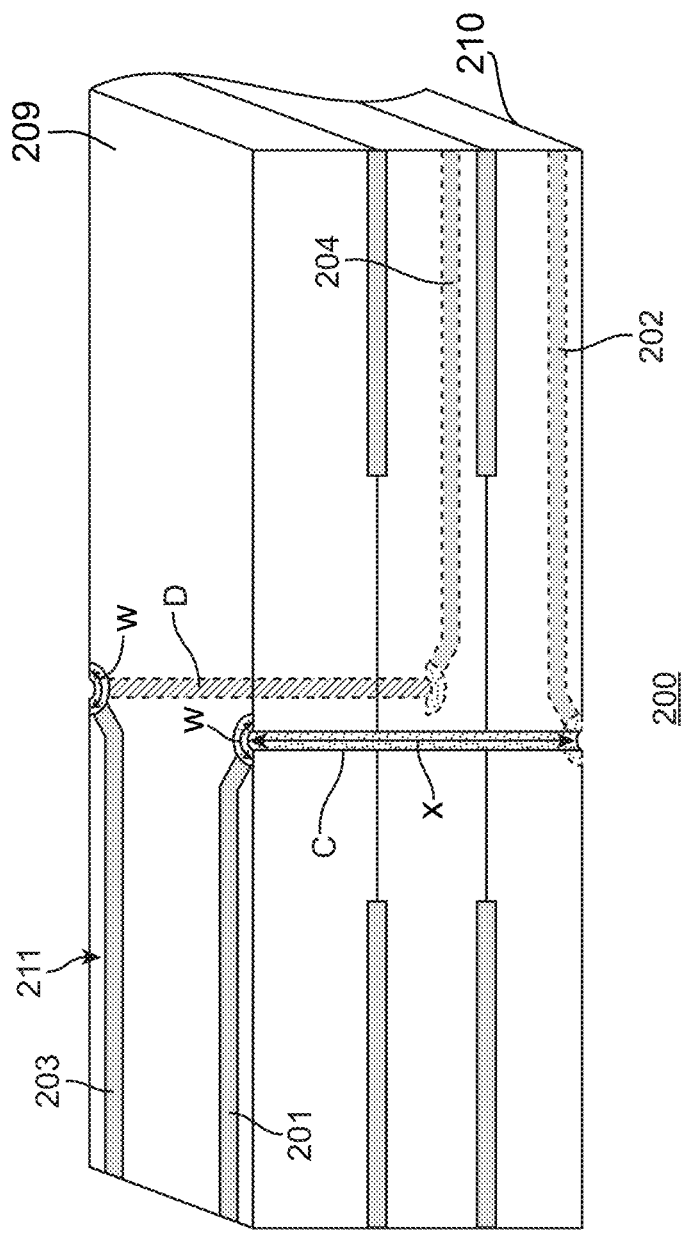
FIG. 2C illustrates another side perspective view of the circuit board in FIG. 2A, in accordance with an embodiment of the invention.

FIG. 2B illustrates a side perspective view of the circuit board 200 in FIG. 2A, in accordance with an embodiment of the invention. The electrically conductive material of the section C represents the remaining electrically conductive material (i.e. coupling element) of the sidewall 205B (FIG. 2A) of the via hole 205 (FIG. 2A). The electrically conductive material of the section C interconnects the trace 201 to the trace 202. Similarly, the electrically conductive material of the section D represents the remaining electrically conductive material of the sidewall 206B (FIG. 2A) of the via hole 206 (FIG. 2A). The electrically conductive material of the section D interconnects the trace 203 to the trace 204.

The electrically conductive material of each section C, D has a length x and a width w (FIG. 2C). In FIGS. 2A and 2B, the width of the electrically conductive material of each section C, D and each trace 201, 202, 203, and 204, is not drawn to scale.

FIG. 2C illustrates another side perspective view of the circuit board 200 in FIG. 2A, in accordance with an embodiment of the invention. The width w of the electrically conductive material of each section C, D is the same. The width w of the electrically conductive material of the each section C, D must be greater than 0 and smaller than a circumference of the corresponding via hole 205 (FIG. 2A), 206 (FIG. 2A). The width w determines the capacitive and inductive loss of the corresponding via hole.

As illustrated in FIG. 2C, the width w of the electrically conductive material of the section C is substantially similar to the width of the interconnected traces 201 and 202. Similarly, the width w of the electrically conductive material of the section D is substantially similar to the width of the interconnected traces 203 and 204. The electrically conductive material of each section C, D provides reduced capacitance and increased impedance continuity (i.e. decreases impedance discontinuity) over the electrically conductive material of each via hole 205 (FIG. 2A), 206 (FIG. 2A) as a whole. One or more ground via holes may be drilled in the vicinity of the via holes 205 and 206 to provide better ground reference for the differential pair 211 (FIG. 2A).

A desired width w of remaining electrically conductive material of a sidewall of a via hole may be determined based on the electrical requirements of interconnected traces, the dielectric material used, and the present width of electrically conductive material of the sidewall of the via hole. Electromagnetic field solver tools, such as ANSYS HFSS, may be used to determine the desired width w. Side-drill-holes in accordance with an embodiment of the invention may be formed to remove excess electrically conductive material, thereby reducing the electrically conductive material of the sidewall of the via hole to the desired width w.

In general, let $r_2$ denote a radius of a side-drill-hole. Let $r_1$ denote a radius of a via hole that the side-drill-hole overlaps. Let $2r_2$ and $2r_1$ denote a diameter of the side-drill-hole and a diameter of the via hole, respectively. Let J and K denote a center of the via hole and a center of the side-drill-hole, respectively. Let l denote a center to center distance between the center J and center K.

The size of a side-drill-hole is controlled by its radius $r_2$. The position of the side-drill-hole is controlled by a center to center distance l.

If a desired center to center distance l is provided, a radius $r_2$ of the side-drill-hole may be determined. In one example implementation, a radius $r_2$ of a side-drill-hole is determined using a radius $r_1$ of a via hole that the side-drill-hole will overlap, a desired center to center distance l, and a desired width w of remaining electrically conductive material of a sidewall of the via hole. An example formula for the radius $r_2$ of the side-drill-hole is provided as follows: $r_2=(r_1^2+l^2+2lr_1 \cos(w/2r_1))^{1/2}$, where $l>0$ and $0<w<2\pi r_1$.

If a desired radius $r_2$ of a side-drill-hole is provided instead, a center to center distance l may be determined. In one example implementation, a center to center distance l is determined using a desired radius $r_2$ of the side-drill-hole, a radius $r_1$ of a via hole that the side-drill-hole will overlap, and a desired width w of remaining electrically conductive material of a sidewall of the via hole. An example formula for the center to center distance l is provided as follows: $l=-r_1 \cos(w/2r_1) \pm (r_2^2 - r_1^2 \sin^2(w/2r_1))^{1/2}$, where $0<w<2\pi r_1$ and $r_2>r_1 \sin(w/2r_1)$. Only $r_2$ values that provide a positive l value may be used.

The example formulas provided above for determining a radius $r_2$ and a center to center distance l may be used to determine a radius $r_2$ and a center to center distance l of each side-drill-hole 207, 208 in FIG. 2A.

A side-drill-hole may have different sizes and positions for a given radius $r_1$ of a via hole and a desired width w of remaining electrically conductive material. Table 1 below provides example diameters $2r_2$ and center to center distances l for a side-drill-hole, wherein the diameters $2r_2$ and the center to center distances l are determined using a given diameter $2r_1$ of 12 mm and a desired width w of 10 mm.

TABLE 1

| Diameter ($2r_2$) of Side-Drill-Hole | Center to Center Distance l |
|---|---|
| 24 MIL | 7.11 MIL |
| 28 MIL | 9.24 MIL |
| 32 MIL | 11.34 MIL |
| 36 MIL | 13.41 MIL |
| 40 MIL | 15.67 MIL |

Example side-drill-holes with different sizes and positions are illustrated in FIGS. 3A-3D.

Figure 3A:
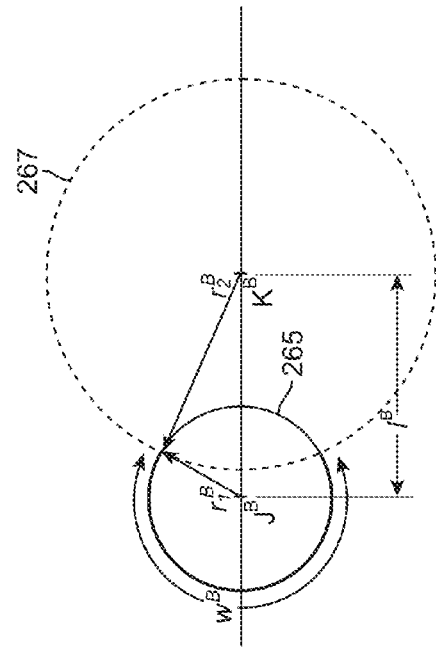
FIG. 3A illustrates an example side-drill-hole (i.e. hole formed along a sidewall of a via hole) overlapping over half of a via hole, wherein a radius of the side-drill-hole is greater than a radius of the via hole, in accordance with an embodiment of the invention.

FIG. 3A illustrates an example side-drill-hole 257 overlapping a via hole 255, in accordance with an embodiment of the invention. As shown in FIG. 3A, a center $K^A$ of the side-drill-hole 257 is positioned outside the via hole 255. A center to center distance between $K^A$ and a center $J^A$ of the via hole 255 is denoted as $l^A$. The side-drill-hole 257 has a radius $r_2^A$ that is greater than a radius $r_1^A$ of the via hole 255. The side-drill-hole 257 overlaps over half of the via hole 255, resulting in a width $w^A$ of remaining electrically conductive material.

Figure 3B:
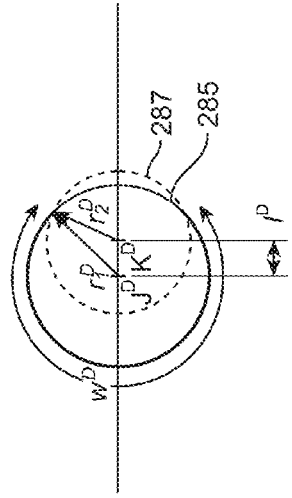
FIG. 3B illustrates an example side-drill-hole overlapping less than half of a via hole, wherein a radius of the side-drill-hole is greater than a radius of the via hole, in accordance with an embodiment of the invention.

FIG. 3B illustrates another example side-drill-hole 267 overlapping a via hole 265, in accordance with an embodiment of the invention. The side-drill-hole 267 has a center $K^B$ and a radius $r_2^B$ that is the same as the radius $r_2^A$ (FIG. 3A). The via hole 265 has a center $J^B$ and a radius $r_1^B$ that is the same as the radius $r_1^A$ (FIG. 3A). Distinguishable from FIG. 3A, a center to center distance $l^B$ between the center $K^B$ and the center $J^B$ in FIG. 3B is greater than the center to center distance $l^A$ (FIG. 3A). Unlike the side-drill-hole 257 (FIG. 3A), the side-drill-hole 267 overlaps less than half of the via hole 265, resulting in a width $w^B$ of remaining electrically conductive material that is greater than the width $w^A$ (FIG. 3A).

Figure 3C:
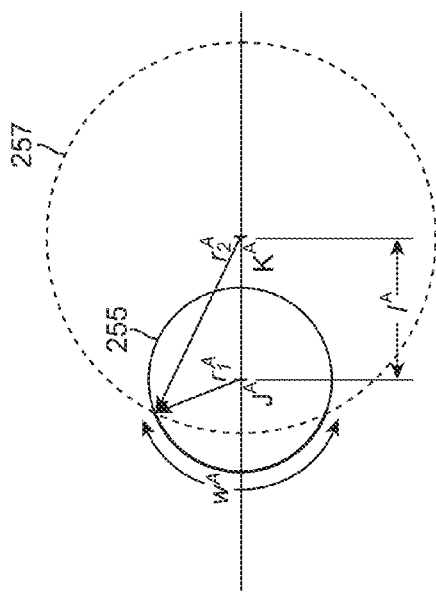
FIG. 3C illustrates an example side-drill-hole overlapping less than half of a via hole, wherein a radius of the side-drill-hole is smaller than a radius of the via hole, in accordance with an embodiment of the invention.

FIG. 3C illustrates another example side-drill-hole 277 overlapping a via hole 275, in accordance with an embodiment of the invention. The via hole 275 has a center $J^C$ and a radius $r_1^C$ that is the same as the radius $r_1^B$ (FIG. 3B). A width $w^C$ of remaining electrically conductive material in FIG. 3C is the same as the width $w^B$ (FIG. 3B). Distinguishable from FIG. 3B, the side-drill-hole 277, with a center $K^C$, in FIG. 3C has a radius $r_2^C$ that is smaller than the radius $r_2^B$ (FIG. 3B), resulting in a center to center distance $l^C$ that is smaller than the center to center distance $l^B$ (FIG. 3B). Thus, unlike the side-drill-hole 267 (FIG. 3B), the side-drill-hole 277 requires less board space on a circuit board. It may, however, be more difficult to find a removal tool (e.g. drilling tool, milling tool) with the smaller radius $r_2^C$ for use in forming the side-drill-hole 277.

Figure 3D:
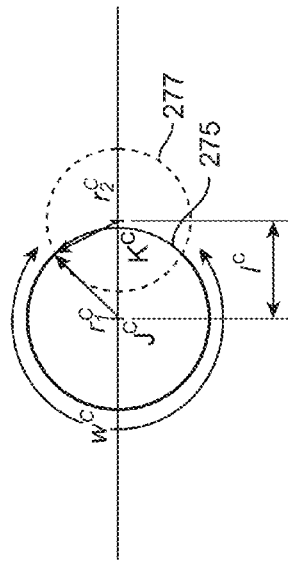
FIG. 3D illustrates an example side-drill-hole overlapping less than half of a via hole, wherein a center of the side-drill-hole is positioned within the via hole, in accordance with an embodiment of the invention.

FIG. 3D illustrates another example side-drill-hole 287 overlapping a via hole 285, in accordance with an embodiment of the invention. The side-drill-hole 287 has a center $K^D$ and a radius $r_2^D$ that is the same as the radius $r_2^C$ (FIG. 3C). The via hole 285 has a center $J^D$ and a radius $r_1^D$ that is the same as the radius $r_1^C$ (FIG. 3C). A width $w^D$ of remaining electrically conductive material in FIG. 3D is the same as the width $w^C$ (FIG. 3C). Distinguishable from FIG. 3C, the center $K^D$ in FIG. 3D is positioned within the via hole 285, resulting in a center to center distance $l^D$ that is even smaller than the center to center distance $l^C$ (FIG. 3C). Thus, the side-drill-hole 287 requires even less board space on a circuit board than the side-drill-hole 277.

Figure 4A:
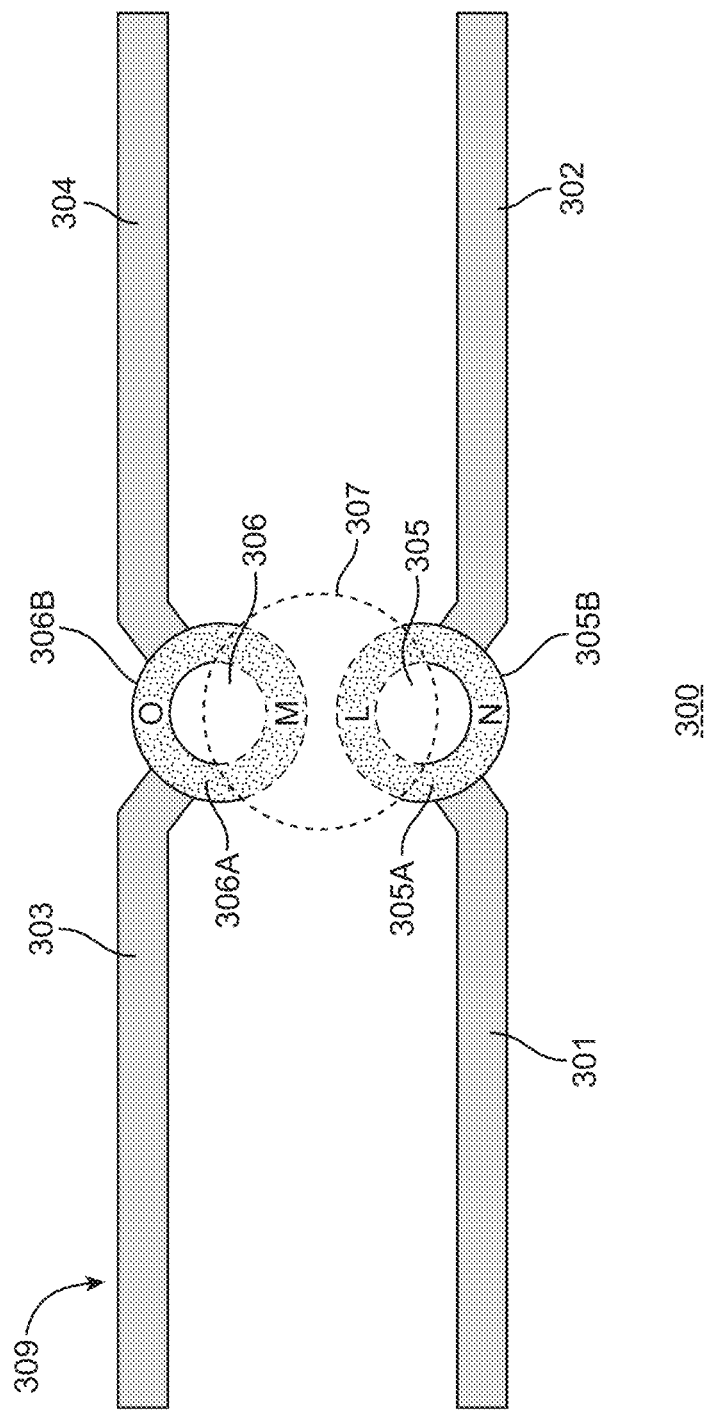
FIG. 4A illustrates a top view of a circuit board including an edge-coupled differential pair with traces and via holes with reduced via capacitance, in accordance with an embodiment of the invention.

FIG. 4A illustrates a top view of a circuit board 300 including an edge-coupled differential pair 309 with traces and via holes with reduced via capacitance, in accordance with an embodiment of the invention. The circuit board 300 comprises the differential pair 309 comprising traces 301, 302, 303, and 304. The traces 301 and 302 are formed on different layers (not shown) of the circuit board 300. The traces 302 and 304 are formed on different layers (not shown) of the circuit board 300.

The differential pair 309 further comprises via holes 305 and 306. The via hole 305 may be formed by drilling a hole through the traces 301 and 302. A sidewall 305B of the via hole 305 is plated with an electrically conductive material 305A, for example copper. The electrically conductive material 305A of the sidewall 305B forms an interconnect that electrically couples the trace 301 to the trace 302.

Similarly, the via hole 306 may be formed by drilling a hole through the traces 303 and 304. A sidewall 306B of the via hole 306 is plated with an electrically conductive material 306A, for example copper. The electrically conductive material 306A of the sidewall 306B forms an interconnect that electrically couples the trace 303 to the trace 304.

In accordance with an embodiment of the invention, excess conductive material is removed from the sidewalls 305B and 306B to reduce capacitance of the via holes 305 and 306, respectively. In one example implementation, a side-drill-hole 307 is formed along the sidewalls 305B and 306B. The side-drill hole 307 may be formed using drilling, milling, etching or other methods. The side-drill-hole 307 overlaps the via hole 305 and removes a section L of the sidewall 305B along with the electrically conductive material thereon. The side-drill-hole 307 removes excess conductive material from the sidewall 305B without depleting the sidewall 305B. The side-drill-hole 307 also overlaps the via hole 306 and removes a section M of the sidewall 306B along with the electrically conductive material thereon. The side-drill-hole 307 removes excess conductive material from the sidewall 306B without depleting the sidewall 306B.

The remaining sidewall 305B after the excess conductive material is removed is illustrated in FIG. 4A as a section N of the sidewall 305B. Similarly, the remaining sidewall 306B after the excess conductive material is removed is illustrated in FIG. 4A as a section O of the sidewall 306B.

Figure 4B:
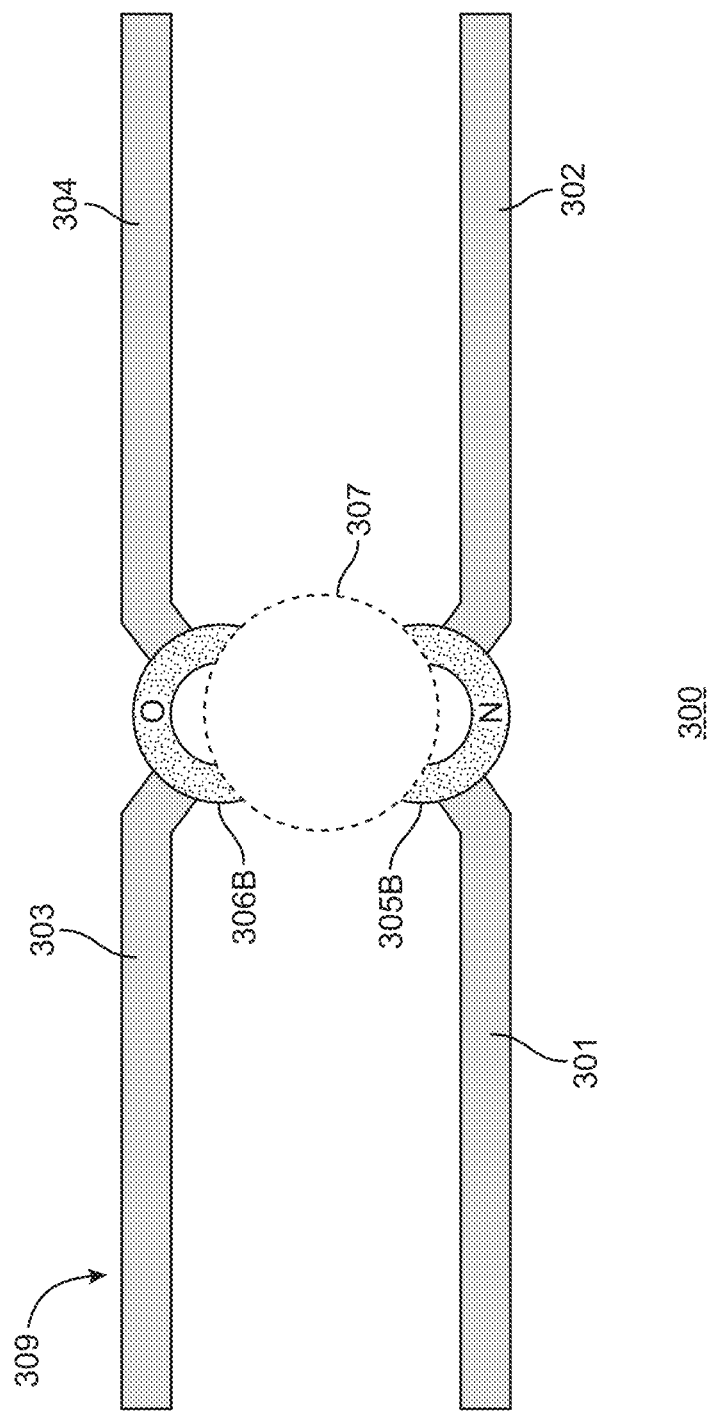
FIG. 4B illustrates another top view of the circuit board in FIG. 4A, in accordance with an embodiment of the invention.

FIG. 4B illustrates another top view of the circuit board 300 in FIG. 4A, in accordance with an embodiment of the invention. The electrically conductive material of the section N represents the remaining electrically conductive material of the sidewall 305B of the via hole 305 (FIG. 4A). The electrically conductive material of the section N interconnects the trace 301 to the trace 302. Similarly, the electrically conductive material of the section O represents the remaining electrically conductive material of the sidewall 306B of the via hole 306 (FIG. 4A). The electrically conductive material of the section O interconnects the trace 303 to the trace 304.

The electrically conductive material of each section N, O has a length x and a width w. The width w of the electrically conductive material of each section N, O is the same. The width w of electrically conductive material of each section N, O must be greater than 0 and smaller than a circumference of the corresponding via holes 305 (FIG. 4A), 306 (FIG. 4A). The width w determines the capacitive and inductive loss of the corresponding via hole.

In FIGS. 4A and 4B, the width of the electrically conductive material of each section N, O and each trace 301, 302, 303, and 304, is not drawn to scale. The width w of the electrically conductive material of the section N is substantially similar to the width of the interconnected traces 301 and 302. Similarly, the width w of the electrically conductive material of the section O is substantially similar to the width of the interconnected traces 303 and 304. The electrically conductive material of each section N, O provides reduced capacitance and increased impedance continuity over the electrically conductive material of each via hole 305 (FIG. 4A), 306 (FIG. 4A) as a whole. One or more ground via holes may be drilled in the vicinity of the via holes 305 and 306 to provide better ground reference for the differential pair 309 (FIG. 4A).

In one example implementation, the radius $r_2$ of the side-drill-hole 307 is determined using the radius $r_1$ of the via holes 305, 306, a center to center distance d between a center of the via hole 305 and a center of the via hole 306, and a desired width w of remaining electrically conductive material. An example formula for the radius $r_2$ of the side-drill-hole 307 is provided as follows: $r_2 = (r_1^2 + d^2/4 + dr_1 \cos((\pi r_1 + w)/2r_1))^{1/2}$, where $d > 0$ and $0 < w < 2\pi r_1$.

Figure 5A:
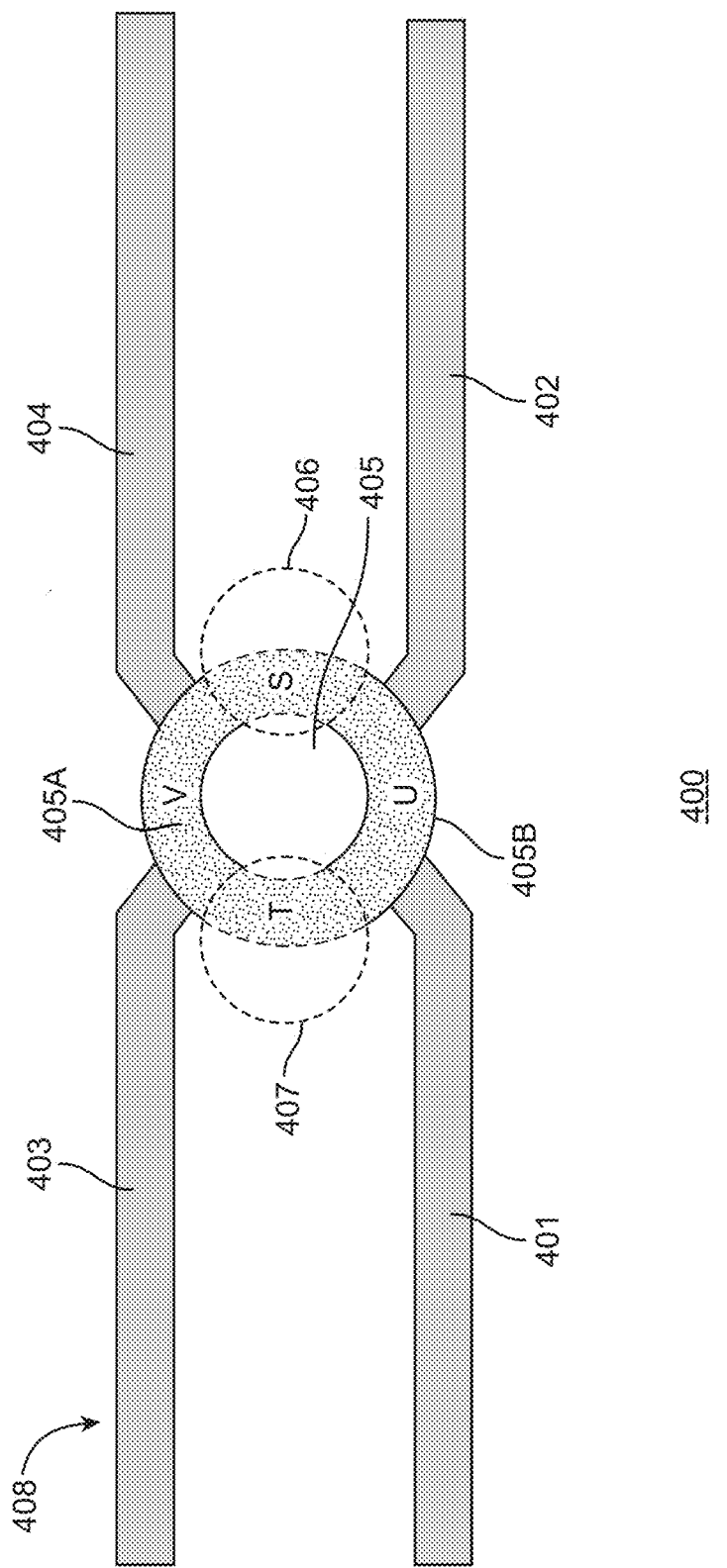
FIG. 5A illustrates a top view of a circuit board including an edge-coupled differential pair with traces and a via hole with reduced via capacitance, in accordance with an embodiment of the invention.

FIG. 5A illustrates a top perspective view of a circuit board 400 including an edge-coupled differential pair 408 with traces and a via hole with reduced via capacitance, in accordance with an embodiment of the invention. The circuit board 400 comprises the differential pair 408 comprising traces 401, 402, 403, and 404. The traces 401 and 402 are formed on different layers (not shown) of the circuit board 400. The traces 403 and 404 are formed on different layers (not shown) of the circuit board 400.

The differential pair 408 further comprises a via hole 405. The via hole 405 may be formed by drilling a hole through the traces 401, 402, 403, and 404. A sidewall 405B of the via hole 405 is plated with an electrically conductive material 405A, for example copper.

In accordance with an embodiment of the invention, excess conductive material is removed from the sidewall 405B to reduce capacitance of the via hole 405. In one example implementation, side-drill-holes 406 and 407 are formed along the sidewall 405B. Each side-drill hole 406, 407 may be formed using drilling, milling, etching or other methods. Each side-drill-hole 406, 407 may have a same radius $r_2$. The side-drill-hole 406 overlaps a side of the via hole 405 and removes a section S of the sidewall 405B along with the electrically conductive material thereon. The side-drill-hole 406 removes excess conductive material from the sidewall 405B without depleting the sidewall 405B. Similarly, the side-drill-hole 407 overlaps an opposite side of the via hole 405 and removes a section T of the sidewall 405B along with the electrically conductive material thereon. The side-drill-hole 407 further removes excess conductive material from the sidewall 405B without depleting the sidewall 405B.

FIG. 5B illustrates another top view of the circuit board 500 in FIG. 5A, in accordance with an embodiment of the invention. The remaining sidewall 405B after the excess conductive material is removed is illustrated as two physically separate sections U and V of the sidewall 405B. The electrically conductive material of the sections U and V represent the remaining electrically conductive material of the sidewall 405B of the via hole 405.

The side-drill-holes 406 and 407 allows for two parts of the differential pair 408 (i.e. a first part comprising the traces 401 and 402, and a second part comprising the traces 403 and 404) to be matched in the same via hole 405. The electrically conductive material of the section U interconnects the trace 401 to the trace 402. The electrically conductive material of the section V interconnects the trace 403 to the trace 404.

The electrically conductive material of each section U, V has a length x and a width w. The width w of the electrically conductive material of each section U, V is the same. The width w of electrically conductive material of each section U, V must be greater than 0 and smaller than a circumference of the via hole 405.

In FIGS. 5A and 5B, the width of the electrically conductive material of each section U, V and each trace 401, 402, 403, and 404, are not drawn to scale. The width w of the electrically conductive material of the section U is substantially similar to the width of the interconnected traces 401 and 402. Similarly, the width w of the electrically conductive material of the section V is substantially similar to the width of the interconnected traces 403 and 404. The electrically conductive material of each section U, V provides reduced capacitance and increased impedance continuity over the electrically conductive material of the via hole 405 (FIG. 5A) as a whole. One or more ground via holes may be drilled in the vicinity of the via hole 405 to provide better ground reference for the differential pair 408.

If a desired center to center distance l is provided, the radius $r_2$ of each side-drill-hole 406, 407 may be determined. In one example implementation, the radius $r_2$ of each side-drill-hole 406, 407 is determined using a radius $r_1$ of the via hole 405, the desired center to center distance l, and a desired width w of remaining electrically conductive material. An example formula for the radius $r_2$ of each side-drill-hole 406, 407 is provided as follows: $r_2=(r_1^2+l^2-2lr_1 \sin(w/2r_1))^{1/2}$, where $l>0$ and $0<w<\pi r_1$.

If a desired radius $r_2$ of each side-drill-hole 406, 407 is provided instead, the center to center distance l may be determined. In one example implementation, the center to center distance l is determined using the radius $r_2$, the radius $r_1$ of the via hole 405, and the desired width w of remaining electrically conductive material. An example formula for the center to center distance l is provided as follows: $l=r_1 \sin(w/2r_1) \pm (r_2^2-r_1^2 \cos^2(w/2r_1))^{1/2}$, where $0<w<\pi r_1$ and $r_2>r_1 \cos(w/2r_1)$.

Figure 6:
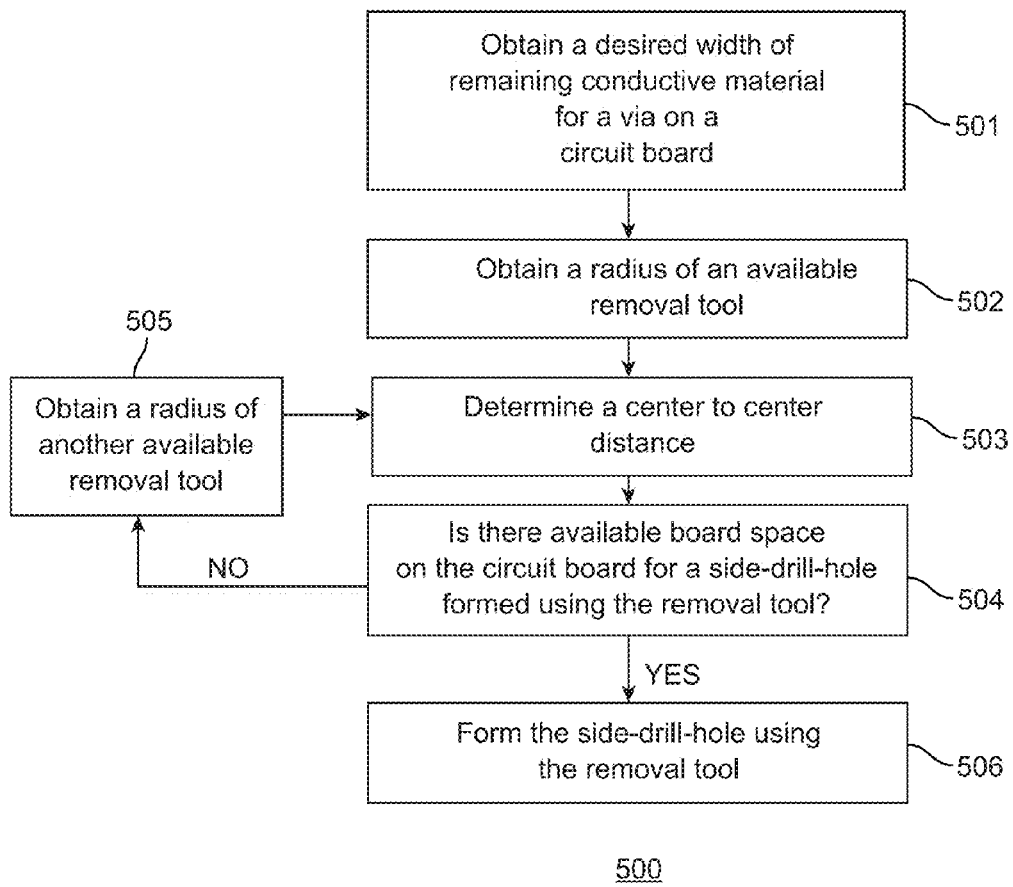
FIG. 6 illustrates a flowchart of an example process 500 for determining a position of a side-drill-hole to remove excess electrically conductive material from a sidewall of a via hole, in accordance with an embodiment of the invention.

FIG. 6 illustrates a flowchart of an example process 500 for determining a position of a side-drill-hole, in accordance with an embodiment of the invention. In process block 501, for a via hole on a circuit board, obtain a desired width w of remaining electrically conductive material of a sidewall of the via hole. The desired width w is based on the electrical requirements of interconnected traces and the present width of electrically conductive material of the sidewall of the via hole. In process block 502, obtain a radius $r_2$ wherein the radius $r_2$ is the radius of an available removal tool (e.g. drilling tool, milling tool) available for use in forming a side-drill-hole to remove excess electrically conductive material from the sidewall of the via hole.

In process block 503, determine a center to center distance l based on w and $r_2$. The center to center distance l is the distance between a center of the via hole and a center of the side-drill-hole. In process block 504, determine if there is available board space on the circuit board for the side-drill-hole with radius $r_2$ and a center positioned l distance away from the center of the via hole. If there is available board space, form the side-drill-hole along a section of the sidewall of the via hole as in process block 506, the side-drill-hole having a radius $r_2$ and a center positioned l distance away from the center of the via hole. If there is no available board space, obtain a different radius $r_2$ of another available removal tool for use in forming the side-drill-hole as in process block 505, and return to the process block 503.

Figure 7:
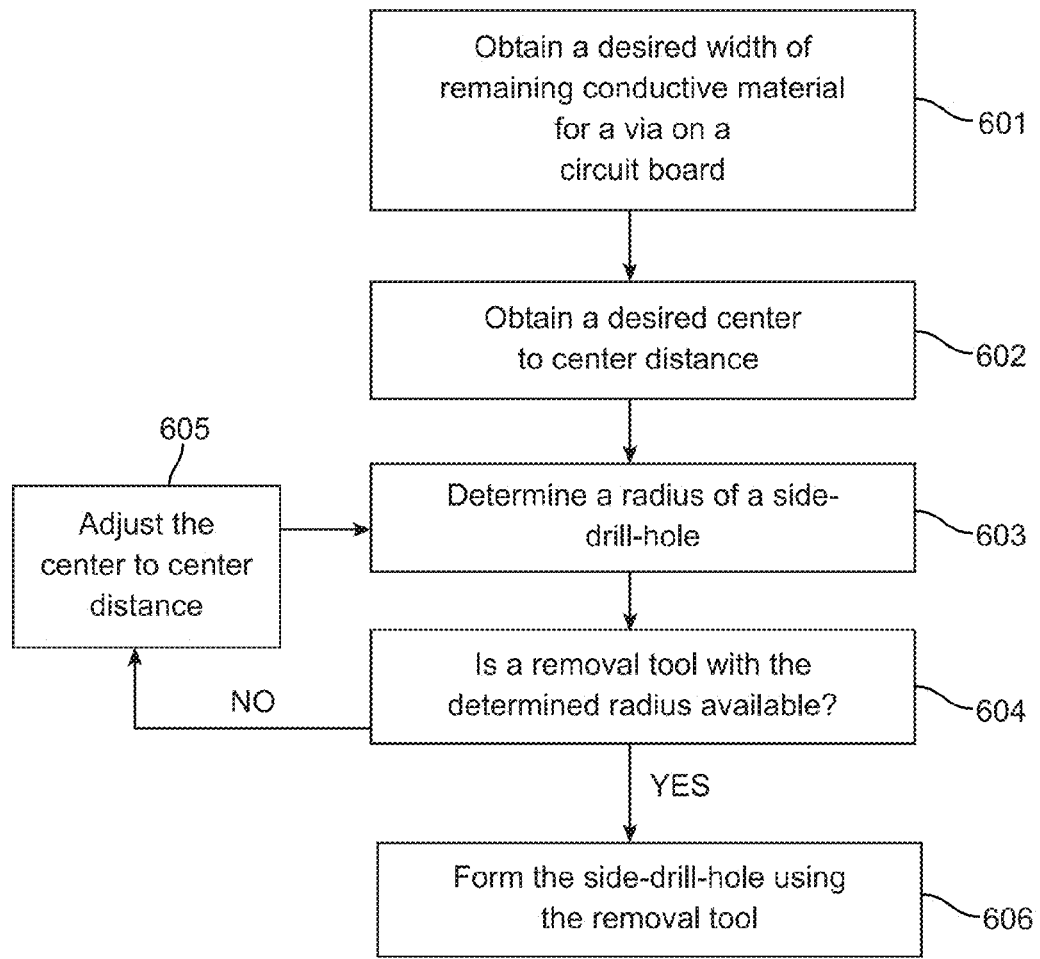
FIG. 7 illustrates a flowchart of an example process 600 for determining a size of a side-drill-hole to remove excess electrically conductive material from a sidewall of a via hole, in accordance with an embodiment of the invention.

FIG. 7 illustrates a flowchart of an example process 600 for determining a size of a side-drill-hole, in accordance with an embodiment of the invention. In process block 601, for a via hole on a circuit board, obtain a desired width w of remaining electrically conductive material of a sidewall of the via hole. The desired width w is based on the electrical requirements of interconnected traces and the present width of electrically conductive material of the sidewall of the via hole. In process block 602, obtain a desired center to center distance. In one example implementation, the center to center distance is the distance between a center of the via hole and a center of a side-drill-hole that will be formed to remove excess electrically conductive material from the sidewall of the via hole. In another example implementation, the center to center distance is the distance between a center of a first via hole and a center of a second via hole, wherein a side-drill-hole overlaps both the first and the second via holes.

In process block 603, determine a radius $r_2$ of the side-drill-hole based on w and the center to center distance. In process block 604, determine if a removal tool (e.g. drilling tool, milling tool) with radius $r_2$ is available for use in forming the side-drill-hole. If a removal tool with radius $r_2$ is available, form the side-drill-hole along a section of the sidewall of the via hole as in process block 606, the side-drill-hole having a radius $r_2$ and a position based on the center to center distance. If a removal tool with radius $r_2$ is not available, adjust the center to center distance as in process block 605, and return to the process block 603.

Excess conductive material may also be removed from a via of a single conductor trace in accordance with embodiments of the invention described above. Excess conductive material may also be removed from vias in integrated circuits in accordance with embodiments of the invention described above.

References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of 35 U.S.C. section 112, sixth paragraph, unless the element is expressly recited using the phrase "means for" or "step for."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for providing an electrical connection between traces disposed on different layers of a circuit board, the method comprising:

forming in the circuit board a via hole that interconnects a pair of electrically conductive traces disposed on different layers of a circuit board, wherein an inner sidewall of the via hole includes electrically conductive material thereon, and wherein the via hole extends between the different layers; and removing a first portion of the electrically conductive material from the inner sidewall by removing a first portion of the inner sidewall, wherein, after removing the first portion of the inner sidewall, a remaining portion of the electrically conductive material on a remaining portion of the inner sidewall interconnects the pair of electrically conductive traces, and wherein the remaining portion of the electrically conductive material has a corresponding width that is substantially similar to a width of each electrically conductive trace of the pair of electrically conductive traces.

2. The method of claim 1, wherein:
the pair of electrically conductive traces comprises a first electrically conductive trace and a second electrically conductive trace; and
the remaining portion of the electrically conductive material provides reduced capacitance.

3. The method of claim 2, wherein the remaining portion of the electrically conductive material provides increased impedance continuity.

4. The method of claim 3, further comprising:
determining, before removing the first portion of the electrically conductive material from the inner sidewall, a desired width of the remaining portion of the electrically conductive material based on one or more electrical requirements associated with the pair of electrically conductive traces and a width of the electrically conductive material on the inner sidewall.

5. The method of claim 4, wherein removing the first portion of the inner sidewall comprises removing a section of the inner sidewall along with the electrically conductive material thereon.

6. The method of claim 5, wherein removing the section of the inner sidewall comprises drilling a drill hole along the inner sidewall such that the drill hole removes the section of the inner sidewall along with the electrically conductive material thereon, and wherein the drill hole overlaps the via hole.

7. The method of claim 6, wherein a radius of the drill hole is determined based on a radius of the via hole, a desired distance between a center of the via hole and a center of the drill hole, and a desired width of the remaining portion of the electrically conductive material.

8. The method of claim 7, wherein a center to center distance between a center of the via hole and a center of the drill hole is determined based on a radius of the via hole, a radius of the drill hole, and a desired width of the remaining portion of the electrically conductive material.

9. A method for providing an electrical connection between traces disposed on different layers of a circuit board, the method comprising:

forming in the circuit board at least one via hole, wherein each via hole interconnects a pair of electrically conductive traces disposed on different layers of a circuit board, wherein an inner sidewall of each via hole includes electrically conductive material thereon, and wherein each via hole extends between the different layers; and for each via hole, removing a first portion of the electrically conductive material from the inner sidewall of the via hole by removing a first portion of the inner sidewall of the via hole, wherein, after removing the first portion of the inner sidewall of the via hole, a remaining portion of the electrically conductive material on a remaining portion of the inner sidewall of the via hole interconnects a pair of electrically conductive traces, and wherein the remaining portion of the electrically conductive material has a corresponding width that is substantially similar to a width of each electrically conductive trace of the pair of electrically conductive traces.

10. The method of claim 9, wherein:
said at least one via hole comprises:
a first via hole that interconnects a first electrically conductive trace and a second electrically conductive trace; and
a second via hole that interconnects a third electrically conductive trace and a fourth electrically conductive trace;
remaining electrically conductive material of the first via hole provides reduced capacitance over the electrically conductive material of the first via hole as a whole; and
remaining electrically conductive material of the second via hole provides reduced capacitance over the electrically conductive material of the second via hole as a whole.

11. The method of claim 10, wherein:
the remaining electrically conductive material of the first via hole provides increased impedance continuity over the electrically conductive material of the first via hole as a whole; and
the remaining electrically conductive material of the second via hole provides increased impedance continuity over the electrically conductive material of the second via hole as a whole.

12. The method of claim 11, wherein:
a physical measurement of the remaining electrically conductive material of the first via hole is substantially similar to a physical measurement of the first trace and the second trace; and a physical measurement of the remaining electrically conductive material of the second via hole is substantially similar to a physical measurement of the third trace and the fourth trace.

13. The method of claim 12, wherein removing a portion of electrically conductive material from each via hole further comprises removing a portion of a sidewall of each via hole along with the electrically conductive material thereon.

14. The method of claim 13, wherein removing a portion of a sidewall of each via hole further comprises drilling a drill hole along the sidewall of each via hole, such that the drill hole removes the portion of the sidewall of the first via hole and the portion of the sidewall of the second via hole, along with the electrically conductive material thereon.

15. The method of claim 14, wherein a radius of the drill hole is determined based on a radius of each via hole, a distance between a center of the first via hole and a center of the second via hole, and a desired width of the remaining electrically conductive material of each via hole.

16. A method for providing an electrical connection between traces disposed on different layers of a circuit board, the method comprising:
   forming in the circuit board a via hole that bridges at least one pair of electrically conductive traces disposed on different layers of a circuit board, wherein an inner sidewall of the via hole includes electrically conductive material thereon, and wherein the via hole extends between the different layers; and
   removing at least one portion of the electrically conductive material from the inner sidewall by removing at least one portion of the inner sidewall, wherein, after removing the at least one portion of the inner sidewall, a remaining portion of the electrically conductive material on a remaining portion of the inner sidewall interconnects the at least one pair of electrically conductive traces, and wherein the remaining portion of the electrically conductive material has a corresponding width that is substantially similar to a width of each electrically conductive trace of the at least one pair of electrically conductive traces.

17. The method of claim 16, wherein:
   the via hole bridges:
      a first electrically conductive trace and a second electrically conductive trace; and
      a third electrically conductive trace and a fourth electrically conductive trace;
   removing at least one portion of the electrically conductive material from the via hole comprises removing a first and a second portion of the electrically conductive material from the via hole;
   a remaining electrically conductive material of a first segment of the via hole provides reduced capacitance over the electrically conductive material of the via hole as a whole; and
   remaining electrically conductive material of a second segment of the via hole provides reduced capacitance over the electrically conductive material of the via hole as a whole.

18. The method of claim 17, wherein:
   the remaining electrically conductive material of the first segment provides increased impedance continuity over the electrically conductive material of the via hole as a whole; and
   the remaining electrically conductive material of the second segment provides increased impedance continuity over the electrically conductive material of the via hole as a whole.

19. The method of claim 18, wherein:
   a physical measurement of the remaining electrically conductive material of the first segment is substantially similar to a physical measurement of the first trace and the second trace; and
   a physical measurement of the remaining electrically conductive material of the second segment is substantially similar to a physical measurement of the third trace and the fourth trace.

20. The method of claim 19, wherein removing a first and a second portion of electrically conductive material from the via hole further comprises removing a first and a second portion of a sidewall of the via hole along with the electrically conductive material thereon.

21. The method of claim 20, wherein removing a first and a second portion of a sidewall the via hole further comprises drilling a first drill hole and a second drill hole along the sidewall, wherein the first drill hole removes the first portion of the sidewall along with the electrically conductive material thereon, wherein the second drill hole removes the second portion of the sidewall along with the electrically conductive material thereon.

22. The method of claim 21, wherein:
   a radius of the first drill hole is determined based on a radius of the via hole, a desired distance between a center of the via hole and a center of the first drill hole, and a desired width of the remaining electrically conductive material of the first segment of the via hole; and
   a radius of the second drill hole is determined based on a radius of the via hole, a desired distance between a center of the via hole and a center of the second drill hole, and a desired width of the remaining electrically conductive material of the second segment of the via hole.

* * * * *